United States Patent
Kerner et al.

(10) Patent No.: US 6,992,629 B2
(45) Date of Patent: Jan. 31, 2006

(54) EMBEDDED RF VERTICAL INTERCONNECT FOR FLEXIBLE CONFORMAL ANTENNA

(75) Inventors: Stephen R. Kerner, Culver City, CA (US); Clifton Quan, Arcadia, CA (US); Raquel Z. Rokosky, Redondo Beach, CA (US)

(73) Assignee: Raytheon Company, Waltham, MA (US)

( * ) Notice: Subject to any disclaimer, the term of this patent is extended or adjusted under 35 U.S.C. 154(b) by 63 days.

(21) Appl. No.: 10/654,121

(22) Filed: Sep. 3, 2003

(65) Prior Publication Data

US 2005/0046510 A1    Mar. 3, 2005

(51) Int. Cl.
*H01Q 23/00* (2006.01)
*H01P 5/02* (2006.01)

(52) U.S. Cl. .................. 343/700 MS; 333/33; 333/246
(58) Field of Classification Search ................. 333/33, 333/246, 260; 343/700 MS
See application file for complete search history.

(56) References Cited

U.S. PATENT DOCUMENTS

| | | | |
|---|---|---|---|
| 5,416,453 A | | 5/1995 | Quan |
| 5,570,058 A | * | 10/1996 | Maruyama ................... 327/404 |
| 5,570,068 A | * | 10/1996 | Quan ........................... 333/33 |
| 5,668,509 A | | 9/1997 | Hoffmeister et al. |
| 6,127,978 A | | 10/2000 | Uematsu et al. |
| 6,236,287 B1 | | 5/2001 | Quan et al. |
| 6,320,547 B1 | | 11/2001 | Fathy et al. |
| 6,683,570 B2 | * | 1/2004 | Skladany et al. .... 343/700 MS |
| 2003/0020173 A1 | | 1/2003 | Huff |

FOREIGN PATENT DOCUMENTS

| | | |
|---|---|---|
| EP | 0534826 A | 3/1993 |
| EP | 0917197 A | 5/1999 |
| EP | 1041665 A | 10/2000 |

OTHER PUBLICATIONS

Simons et al: "New Coplanar Waveguide/Stripline Feed Network for Seven Patch Hexagonal CP Subarray" Electronic Letters, IEE Stevenage, GB, vol. 27, No. 6, Mar. 14, 1991, pp 533-535.
Sashi Sanzgiri et al., "Hybrid Tile Approach for KA Band Subarray Modules," IEEE Trans. Ant. and Prop., vol. 43, No. 9, Sep. 1, 1995, pp 953-959.
International Search Report, PCT/US 2004/023358, mailed Feb. 9, 2005, 3 pages.

* cited by examiner

*Primary Examiner*—Benny T. Lee
(74) *Attorney, Agent, or Firm*—Leonard A. Alkov; Karl A. Vick

(57) ABSTRACT

An RF signal transition includes a channelized microstrip transmission structure, and a coplanar wave guide structure in electrical communication with the channelized microstrip transmission structure. A caged troughline transition structure is in electrical communication with the coplanar wave guide structure. A caged coaxial transmission structure is in electrical communication with the troughline transition structure. The signal transition may be embedded in a flexible printed wiring board structure with a circulator for a conformal antenna structure.

26 Claims, 5 Drawing Sheets

EMBEDDED RF VERTICAL INTERCONNECT FOR FLEXIBLE CONFORMAL ANTENNA

BACKGROUND

Typical active array architectures include one or more ferrite circulators for passive duplexing and control of scattering in microwave antennae. These circulators are passive "discrete" microwave devices, which may include, e.g., a microstrip/stripline resonator circuit on a ferrite substrate that is sandwiched between a magnet and magnetic carrier plate.

For a conformal panel architecture, the active devices comprising the T/R modules can be mounted on the back of the panel. The circulators are situated between the radiating apertures and T/R modules. There exists a need to be able to bury these microwave devices, e.g., circulators and other microwave devices, e.g., integrated circuits comprising switches, filters and MEMs, while realizing the vertical transitions to interconnect the devices to the other components within the antenna, e.g., Transmit/Receive modules (T/R modules) and radiators. Burying microwave circulators and other discrete microwave devices poses a challenge.

SUMMARY OF THE DISCLOSURE

An RF signal transition comprises a channelized microstrip transmission structure, and a coplanar wave guide structure in electrical communication with the channelized microstrip transmission structure. A caged troughline transition structure is in electrical communication with the coplanar wave guide structure. A caged coaxial transmission structure is in electrical communication with the troughline transition structure. The signal transition may be embedded in a flexible printed wiring board structure with a circulator for a conformal antenna structure.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION OF THE DISCLOSURE

Figure 1:
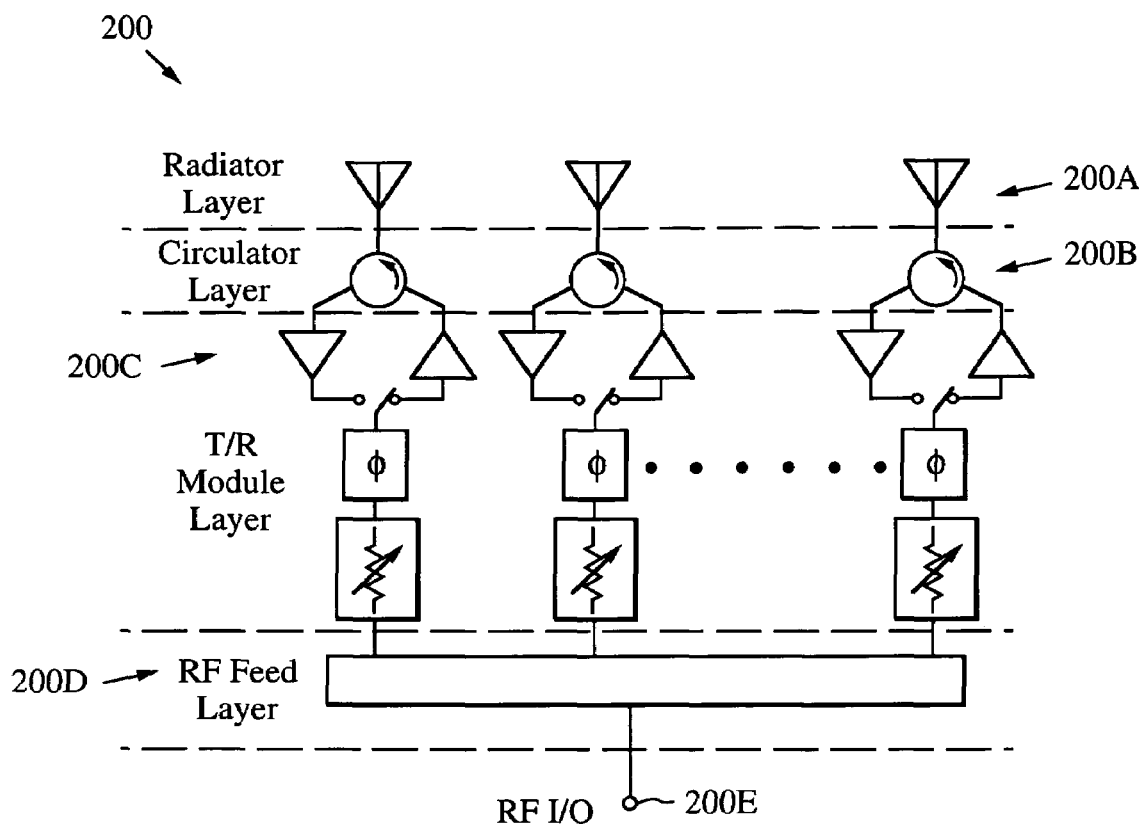
FIG. 1 is a functional block diagram of an embodiment of an active array which can be fabricated in accordance with aspects of the invention.

In the following detailed description and in the several figures of the drawing, like elements are identified with like reference numerals.

FIG. 1 is a schematic block diagram of an exemplary embodiment of a active array system 200 which can be implemented in accordance with aspects of this invention. In a general sense, the array includes a radiator layer 200A, a circulator layer 200B, a T/R module layer 200C, and an RF feed layer 200D, with an RF input/output (I/O) port 200E. The T/R module layer includes for each circulator in the layer 200B a phase shifter and an attenuator, as well as a receive amplifier and a transmit amplifier connected to ports of the circulator through a T/R switch. Structures of the array system can be implemented in multiple layers to provide a conformal radiating aperture.

Figure 2:
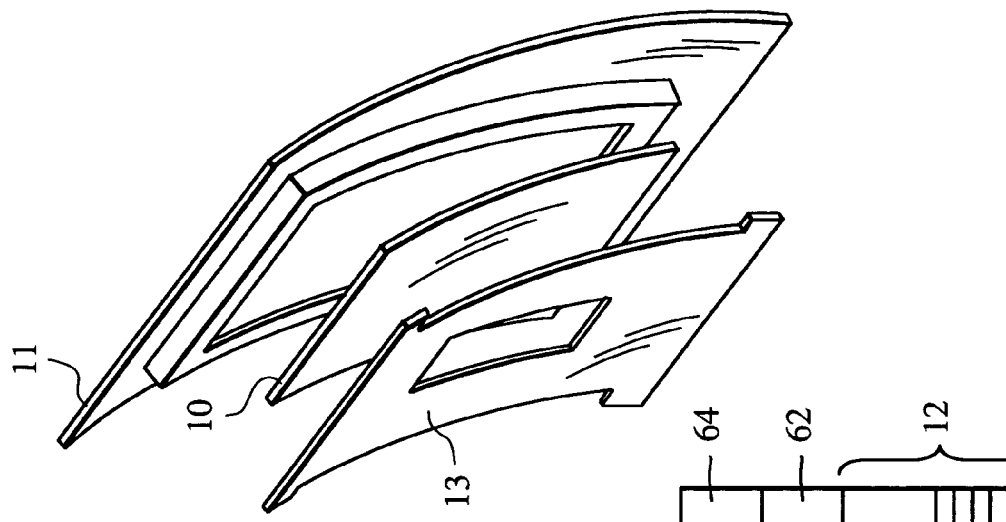
FIG. 2 shows an exploded perspective view of a conformal antenna assembly including a multi-layered conformal RF transition structure according to an embodiment of the present invention.

Turning now to FIG. 2 there is shown an exploded perspective view of a conformal antenna assembly including a multi-layered conformal RF transition structure 10 according to an embodiment of the present invention. The conformal antenna also includes an aperture structure 11 and a backplate 13 between which the RF transition structure 10 may be sandwiched. To conform to the curved nature of the antenna aperture, the structure 10 comprises, in an exemplary embodiment, a flexible, curved multilayered conformal antenna RF transition structure.

Innovations include a new combination of transmission line structures used in this transition, and lamination processes utilized in creating three dimensional microwave transmission lines structures in the flexible sections, e.g., section 12.

Figure 2A:
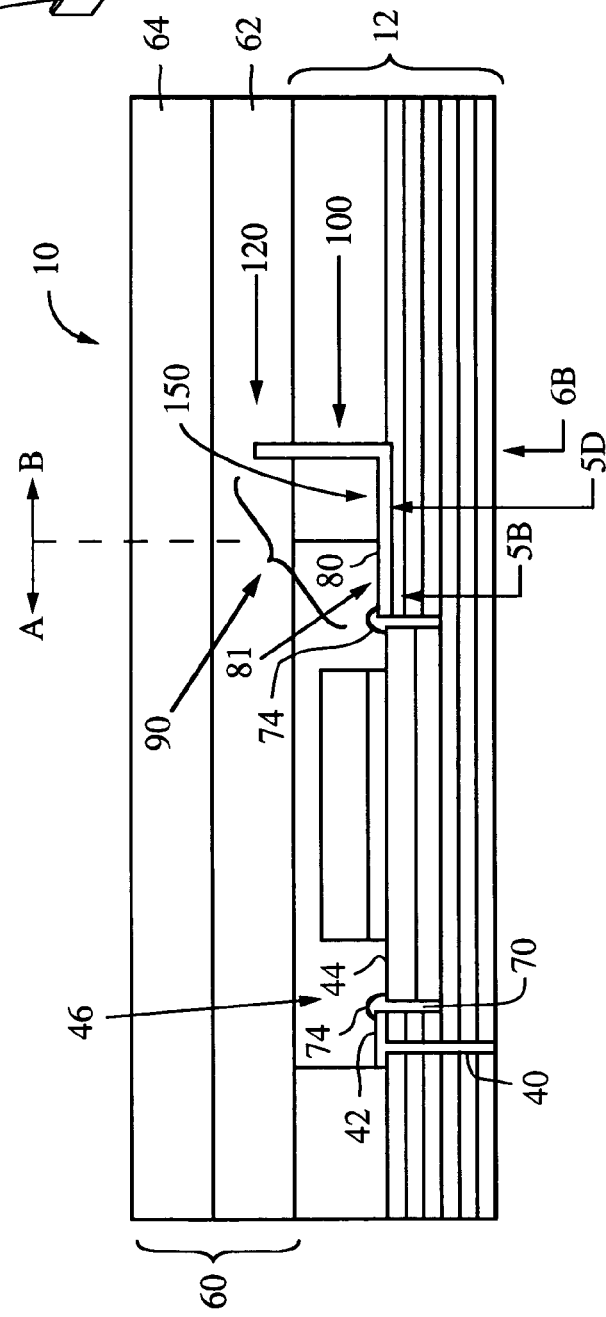
FIG. 2A is a simplified schematic cutaway of a portion of the RF transition portion of FIG. 2.

FIG. 2A shows a schematic, cutaway view of a lower portion of the transition structure 10 of FIG. 2. A microstrip circulator 44 is mounted into the flexible multi-layered lower section 12 of the structure 10 in a generally rectangular opening 70 that is formed in section 12 as explained in more detail below. The cavity air pockets 46 may also be machined into selected layers of section 12 prior to a lamination process, also as described below. Gold wires or ribbon bonds 74 are used to connect corresponding microstrip traces to and from the circulator 44 to and from the microstrip traces 42, 80 on the top surface of the section 12.

FIG. 2A shows a schematic representation of the positioning of an RF vertical transition 90 through a laminated multilayer flexible printed wiring board (PWB) 12 and the balun and radiating aperture assembly 60 including a balun layer 62 and radiator assembly layer 64. The interconnect 90 interconnects the microstrip conductor 80 connected to the circulator 44, to the upper layer assembly 60. The vertical RF transition 90 can include several microwave transmission line structures 80, 150, 100, 120 to reshape the electromagnetic field configuration of the RF signal from the microstrip 80 connected to circulator 44 to that of a "caged" coaxial transmission line structure as the RF signal enters the layer assembly 60. There is also a microstrip to vertical caged coaxial transmission structure 40 for connecting the T/R module to the circulator. In this view only one structure 40 is illustrated; however it will be understood that two structures 40 are provided for each circulator to provide the transmit or receive connection between the T/R module and the circulator as shown in FIG. 1.

It will be appreciated that the exemplary embodiment of the antenna of FIG. 1 is adapted for transmit and receive operations, and so it will be understood that generally the "input" and "output" ports of various circuits can also be used as "outputs" and "inputs" unless otherwise apparent from the circuits.

Figure 3B:
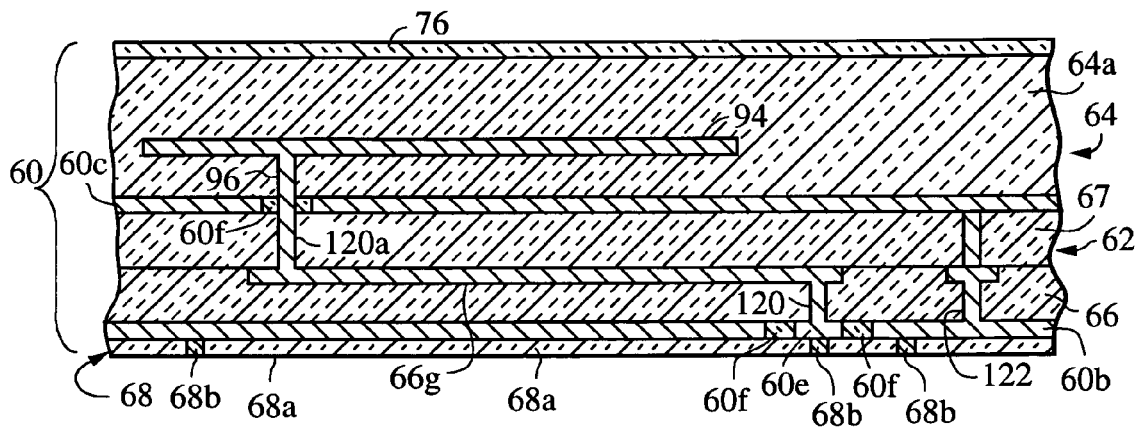
FIG. 3B shows a schematic cross-sectional view of a second portion of the embodiment of the present invention.
Figure 3A:
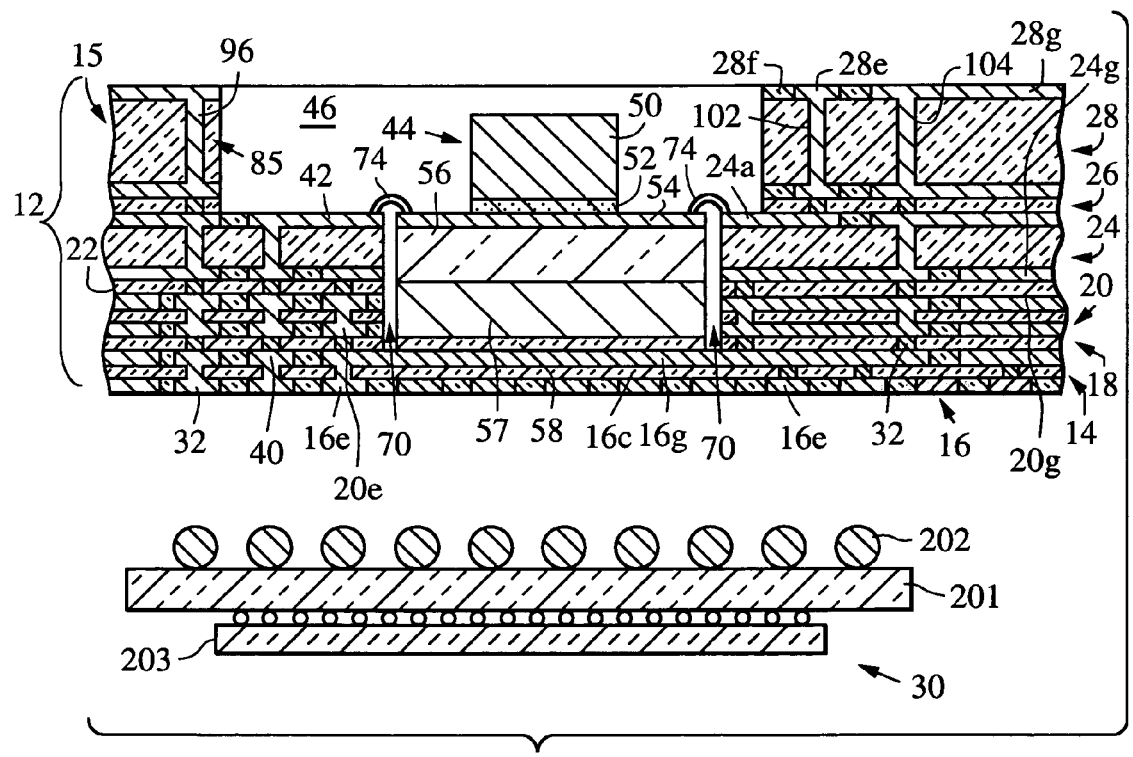
FIG. 3A shows a cross-sectional partially exploded schematic view of a first portion of an embodiment of the present invention shown.

FIG. 3A shows a cross-sectional schematic view of a portion of the PWB 12 comprising a lower portion of the structure 10. An RF transmit receive interface module 30 is connected to the PWB 12, and may include a flip chip assembly or chip-scale package including an IC flip chip 203 having a ball-grid 201 including solder balls 202 respectively aligned with many of the catchpads 16e in the laminate 12. The IC chip 203 integrates functions of a T/R module in this exemplary embodiment. The module 30 is electrically connected to the structure 10 through solder ball connections to the catchpads. The module 30 allows RF and DC signals to be connected to the PWB.

FIG. 3B shows in cross section the upper portion 60 of the structure 10 which is assembled to the portion 12. The upper portion 60 comprises a balun layer 62 and a radiator assembly layer 64. The balun layer 62 may be formed of a lower dielectric balun layer 66 and an upper dielectric balun layer 67 sandwiched between a lower metal layer 60b and an upper metal layer 60c. The lower metal layer 60b forms a ground plane, and has formed therein a cutaway 60f within which may be formed a catchpad 60e formed to connect the vertical transition line 102 (FIG. 3A) with the coaxial vertical transition 120. The lower balun layer 66 may also have a via and catchpad forming a portion of a groundplane interconnect 122. The lower balun layer 66 may also have formed thereon a signal transmission strip conductor pattern formed in a metalization layer 66g formed on the upper surface of the lower balun layer 66. The upper balun layer 67 may have formed on its upper surface the metalization layer 60c which forms a groundplane, and has cut in it a clearout 60f through which passes a vertical coaxial signal transition 120a.

The radiator layer 64 includes a dielectric layer 64a which has embedded therein a radiator conductor pattern defining a plurality of radiators, including exemplary radiator 94, which is electrically connected to the vertical transition 120a. The radiator assembly layer 64 has formed therein, as shown in FIG. 3B, a via 96 for connection with the vertical coaxial transition 120a through a clearout 60f in the upper metal layer 60c of the balun layer 62. A dielectric radome layer 76 covers the top surface of layer 64a.

The balun and radiator layer assembly 60 may be attached to an upper metal layer 28g (FIG. 3A) of an upper dielectric laminate 28 of the PWB 12 by an adhesive layer 68. The layer 68 may contain a layer 68a of bondply adhesive having formed in it vias 68b filled with conductive ink for electrical connection through the adhesive layer 68, e.g., between the catchpad 60e at the lower end of the signal transition line 120 and the catchpad 28e at the upper end of the trough line 102, or between the groundplane 28g on the upper surface of the laminate 28 and the groundplane formed by the metalization layer 60b on the bottom of the laminated layer 60. This can provide a connection to a ground plane interconnection 122 connecting the groundplane 60b on the bottom surface of the balun layer 66 with the groundplane 60c on the upper surface of the balun layer 67. In this exemplary embodiment, the balun layer 62 is formed of the two balun layers 66, 67 for ease of forming the metalization 66g (FIG. 3B) on the upper surface of the lower balun layer for forming a horizontal signal transition pattern 66g thereon.

The adhesive layer 68 in this exemplary embodiment may be a Z-axis adhesive which electrically connects the catchpads 60e (in the lower metal layer 60b of the balun layer 66) and 28e (connected to the upper end of the trough line 102), and also the respective ground planes 60b and 28g. The Z axis adhesive, e.g., a layer of 3M 7373 or 3M 9703 manufactured by 3M, in the regions of the catchpads 60e, 28e and ground-planes 60b and 28g will be squeezed together, and in the areas of the clearouts 60f and 28f. Therefore, the randomly distributed conductive particles contained in the Z-axis adhesive will form an anisotropic vertical electric connection between the catchpad 60e and the catchpad 28e and between the ground planes 60b and 28g, while not shorting the vertical transitions 102, 120 to the respective ground planes 60b and 28g in the region of the clearouts 60f and 28f. This allows the flexible DC/RF manifold assembly 12 to be electrically attached to the upper balun and radiating layers 62, 64 as that assembly is formed of increasing curvature. Such connections are suitable for DC and microwave frequencies, e.g., across a planar and curved surface interface, assuming that the section 12 is more relatively planar, i.e., less curved, than the balun/radiator section 6. The balun/radiator section 60 may be a part of the structure of the aperture structure 11, e.g. an embedded dipole aperture structure.

This use of Z-axis adhesive may be substituted for some or all of the other adhesive layers 18, 22 and 26, e.g. to accommodate further flexibility of the section 12.

Figure 3C:
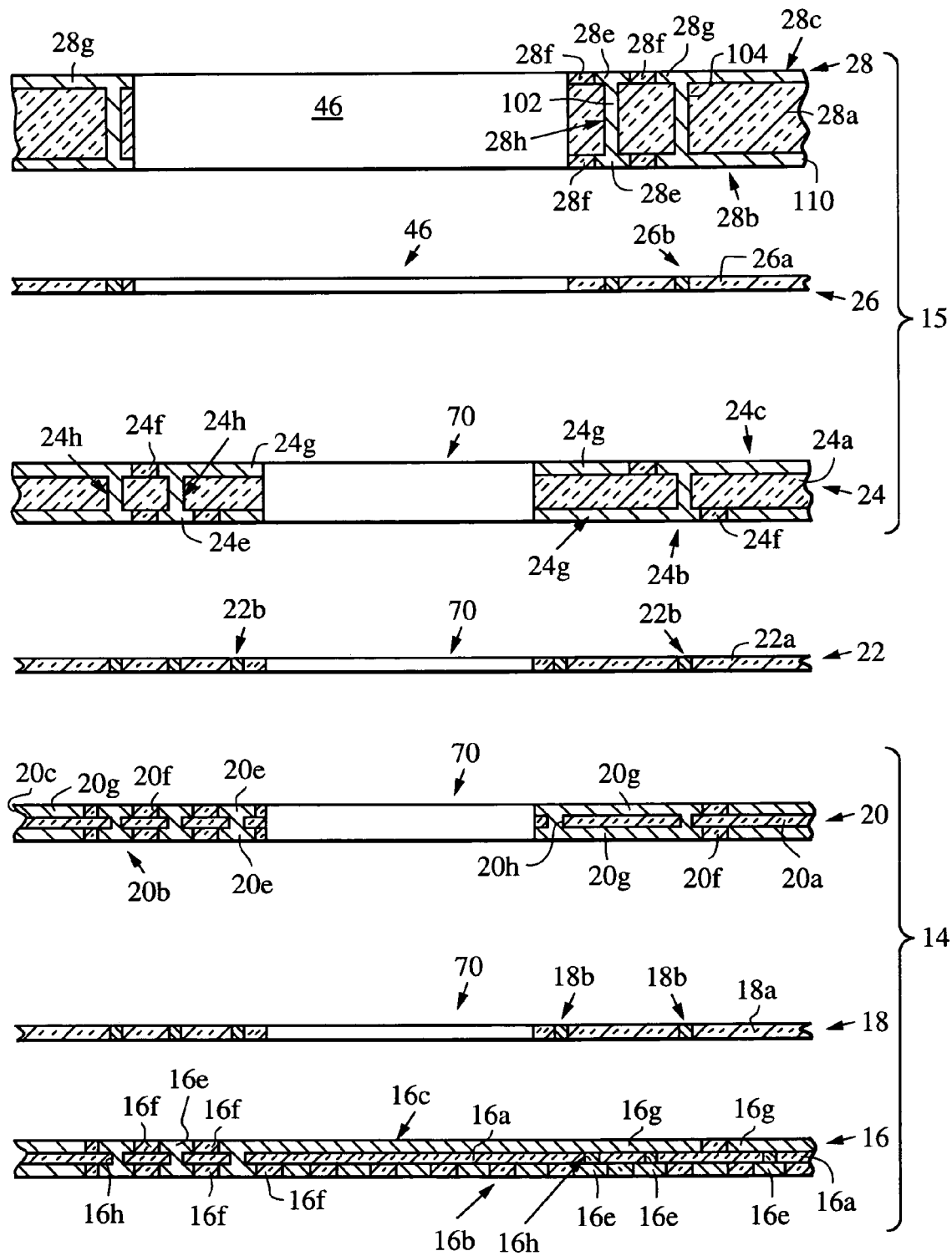
FIG. 3C shows an exploded schematic cross-sectional view of the embodiment of the present invention shown in FIGS. 3A and 3B.

Turning now to FIG. 3C, there is shown an exploded cross-sectional view of the exemplary multilayered conformal PWB assembly 12 which serves as an RF/DC feed section in this embodiment. In an exemplary embodiment, the PWB 12 includes sections 14 and 15. The section 14 may be made up of a lower dielectric laminate 16 and an upper dielectric laminate 20.

The lower dielectric laminate 16 may be of about 6 mils in thickness and may include a lower dielectric layer 16a of about 2 mils in thickness, which may be made of KAPTON (TM) polyimide, which may be sandwiched between a lower metal layer 16b and an upper metal layer 16c, each of which may be etched to form, e.g., catchpads 16e, clearouts 16f, and ground/signal plane 16g. These dimensions are for an exemplary embodiment. The dielectric layer 16a may itself be formed with pre-cut or pre-drilled via openings 16h that may be filled with conductive ink as is known in the art to connect, e.g., a catchpad 16e in the lower metal layer 16b to a ground/signal plane 16g in the upper metal layer 16c.

Above the lower dielectric laminate 16 may be a lower adhesive layer 18, which may be on the order of about 3 mils thick. The lower adhesive layer 18 may comprise a layer of bondply adhesive 18a, which may be predrilled or precut to form via openings 18b filled with conductive ink for connecting, e.g., catchpads 16e and/or ground/signal planes 16g in the upper metal layer 16c of the lower dielectric laminate 16 through the lower adhesive layer 18. The adhesive layer 18 may also have cut into it a portion of the opening 70 that will be formed when the layers 16, 18, 20, 22 and 24 are laminated together.

Above the lower adhesive layer 18 may be an upper dielectric laminate 20, which may be of about 6 mils in thickness and may include an upper dielectric layer 20a of about 2 mils in thickness, which may be made of KAPTON (TM) polyimide, which may be sandwiched between a lower metal layer 20b and an upper metal layer 20c, each of which may be etched to form, e.g., catchpads 20e, clearouts 20f, and ground/signal planes 20g. The dielectric layer 20a may itself be formed with pre-cut or pre-drilled via openings 20h that may be filled with conductive ink as is known in the art to connect, e.g., a catchpad 20e in the lower metal layer 20b to a ground/signal plane 20g in the upper metal layer 20c. The upper dielectric layer 20a may also have cut into it a portion of the opening 70 that will be formed when the layers 16, 18, 20, 22 and 24 are laminated together.

Above the upper dielectric laminate 20 may be a middle adhesive layer 22, which may be on the order of about 3 mils thick. The middle adhesive layer 22 may comprise a layer of bondply adhesive 22a, which may be predrilled or precut to form via openings 22b filled with conductive ink for connecting, e.g., catchpads 20e and/or ground/signal planes 20g in the upper metal layer 20c of the upper dielectric laminate 20 through the middle adhesive layer 22. The adhesive layer 20 may also have cut into it a portion of the opening 70 that will be formed when the layers 16, 18, 20, 22 and 24 are laminated together.

Above the middle adhesive layer 22 may be the upper section 15 of the multilayered laminate section 12. The upper section 15 may include a lower dielectric laminate 24, which may be on the order of about 10 mils thick. The lower dielectric laminate 24 may be fabricated of a dielectric layer 24a, such as DUROID (TM) PTFE laminate, sandwiched between a lower metal layer 24b and an upper metal layer 24c, each of which may be etched to form, e.g., catchpads 24e, clearouts 24f, and ground/signal planes 24g. The lower dielectric layer 24a may itself be formed with pre-cut or pre-drilled via openings 24h that may be filled with conductive ink as is known in the art to connect, e.g., a catchpad 24e in the lower metal layer 24b to a ground/signal plane 24g in the upper metal layer 24c. The lower dielectric laminate 24 may also have cut into it a portion of the opening 70 that will be formed when the layers 16, 18, 20, 22 and 24 are laminated together.

Above the lower dielectric laminate 24 may be formed an upper adhesive layer 26, which may be on the order of about 3 mils thick. The upper adhesive layer 26 may comprise a layer of bondply adhesive 26a, which may be predrilled or precut to form via openings 26b filled with conductive ink for connecting, e.g., catchpads 24e and/or ground/signal planes 24g in the upper metal layer 24c of the lower dielectric laminate 24 through the upper adhesive layer 26. The upper adhesive layer 26 may also have cut into it a portion of the opening 70 that will be formed when the layers 16, 18, 20, 22 and 24 are laminated together.

Above the upper adhesive layer 26 may be formed an upper dielectric laminate 28, which may be on the order of about 60 mils thick. The upper dielectric layer 28 may be formed of a dielectric layer 28a, e.g. a DUROID (TM) PTFE laminate layer, sandwiched between a lower metal layer 28b and an upper metal layer 28c, each of which may be etched to form, e.g., catchpads 28e, clearouts 28f, and ground/signal planes 28g. The upper dielectric layer 28a may be formed with pre-cut or pre-drilled via openings 28h that may be filled with conductive ink to connect, e.g., a catchpad 28e in the lower metal layer 28b to a catchpad 28e in the upper metal layer 28c, e.g., as part of transition 102. The upper dielectric laminate 28 may also have cut into it opening 46.

When laminated together, as shown in FIG. 3A, the respective catchpads 16e, 20e, and 28e along with respective ground/signal planes 16g, 20g, 24g and 28g may form, e.g., ground plane interconnection path 32 or an RF vertical signal transition 40, e.g., between the T/R module 30 and the buried RF feed microstrip 42 formed by a portion of the upper metal layer 28c of the upper dielectric laminate 28 as shown in FIGS. 3A, 3C.

The buried microstrip circulator 44 (FIG. 3A) may comprise a permanent magnet 50 which is atop the buried microstrip circulator circuitry formed in a layer of metalization 54 formed on top of a ferrite layer 56, which in turn is on a steel carrier 57 connected to a portion of a ground plane 16g formed in the metal layer 16c of the laminate 16 by a layer 58 of conductive epoxy. The permanent magnet 50 is separated from the circulator layer 54 by a dielectric spacer 52. The circulator 44 may be connected to the buried RF feed microstrip 42 by wire or gold ribbon 74.

The structure 10 can be formed as a curved, conformal structure, as illustrated in FIG. 2.

Figure 4:
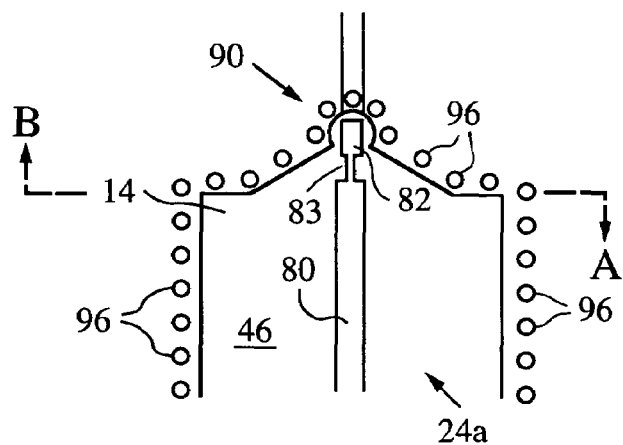
FIG. 4 shows a top schematic representation of a portion of a microstrip connecting the circulator to a vertical RF transition according to an embodiment of the present invention.

FIG. 4 shows a top schematic representation of a portion of the microstrip conductor 80 and RF vertical transition 90 (FIG. 2A). The microstrip conductor 80 has a contact pad 82 at one end thereof, and is fabricated on a top surface of the dielectric layer 24a of the lower laminate 24 (FIG. 3A). Conductor filled plated vias 85 (FIG. 3A) are formed along the periphery of each air pocket cavity 46 and surrounding transition 102 (FIG. 3A) as explained in more detail below. The plated vias 85 also serve to form groundplane interconnects 96 (FIG. 4) to create a virtual sidewall for the cavities 46, sufficient for creating an RF shielded cavity 46 necessary for RF transmission line structures.

As shown in FIG. 4, the region of the cavity 46 in the direction of arrow A (see also FIG. 2A) contains the microstrip conductor 80 with an air dielectric over the microstrip conductor. In the region of the cavity 46 in the direction of arrow B (see also FIG. 2A) the microstrip contact pad 82 passes through clearout 28f (FIG. 3A) extending toward the catchpad 28e on the lower end of the vertical transition 102 and the contact pad 82 is contacted by the catchpad 28e. In this region the conductor trace may be covered with a dielectric, e.g. comprising laminate 28. The location of the transition marked by arrows A and B is also shown in FIG. 2A.

Figure 5A:
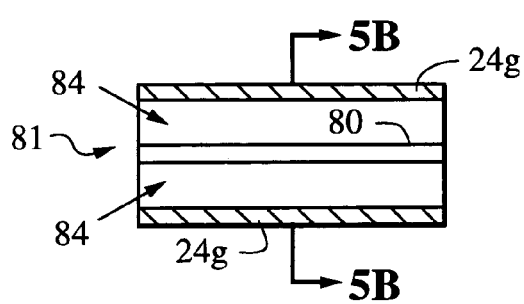
FIGS. 5A and 5B show, respectively, a top view and a cross-sectional view along lines 5B, of a schematic representation of a portion of a microstrip connecting the circulator to a vertical RF transition according to an embodiment of the present invention.
Figure 5C:
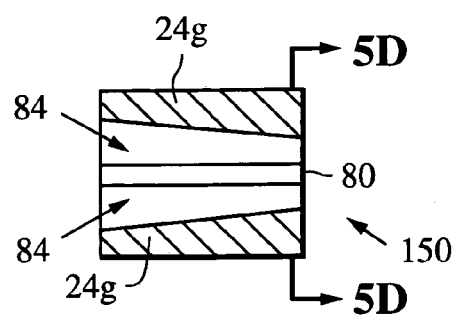
FIGS. 5C and 5D show, respectively, a top view and a cross-sectional view along lines 5D, of a schematic representation of another portion of the microstrip connecting the circulator to a vertical RF transition according to an embodiment of the present invention.
Figure 5B:
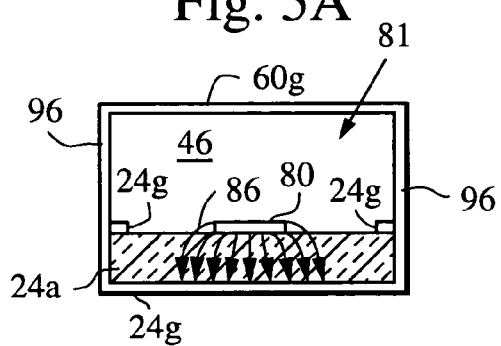

FIGS. 5A and 5B show, respectively, a top view and a cross-sectional view, taken along lines 5B—5B in FIG. 5A, of a schematic representation of a portion of the microstrip trace 80, comprising a channelized microstrip transmission structure 81 at area 5B (FIG. 2A), interconnecting the gold wire or ribbon bond 74 from the circulator 44 to the contact pad 82 (FIG. 4), at area 5B (FIG. 2A). Side walls of the opening 46 have formed therein conductive vias 96 (FIG. 4) to define a metallized channel. Field lines 86 (FIG. 5B) depict the shape of the electric field for the channelized transmission structure.

Figure 5D:
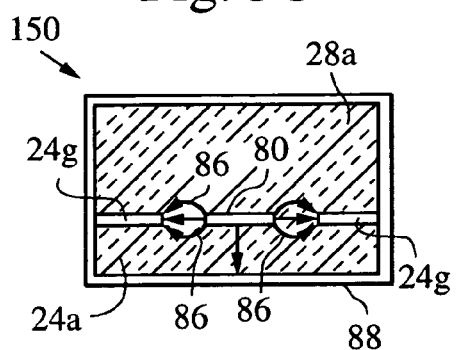

FIGS. 5C and 5D show, respectively, a top view and a cross-sectional view taken along lines 5D—5D of FIG. 5C, of a schematic representation of another transmission structure 150 interconnecting the gold wire or ribbon bond 74 from the circulator 44 to the contact pad 82. The location of 5D is shown also in FIG. 2A. The channelized microstrip 81 transitions to the channelized, conductor backed, dielectric filled, coplanar waveguide (CPW) transmission structure

150, since the ground planes 24G close in on the conductor strip 80, resulting in reshaping of the electromagnetic fields. Thus, the gap 84 between the microstrip conductor 80 and the ground conductors 24g is tapered from the spacing at the junction between the structures 81 and 150 to a smaller gap size at the vertical transmission structure 100 (FIG. 6A).

Figure 6A:
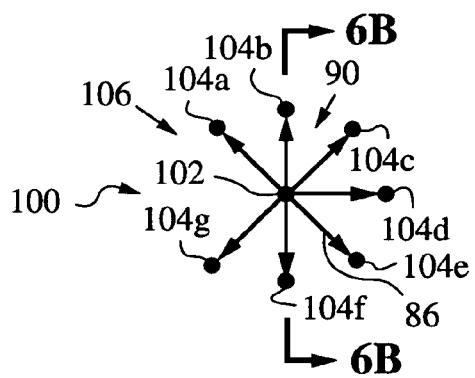
FIGS. 6A and 6B show respectively a top view and a cross-sectional view along the lines 6B, of a caged troughline transition line contained within the PWB 16 according to an embodiment of the present invention.
Figure 6B:
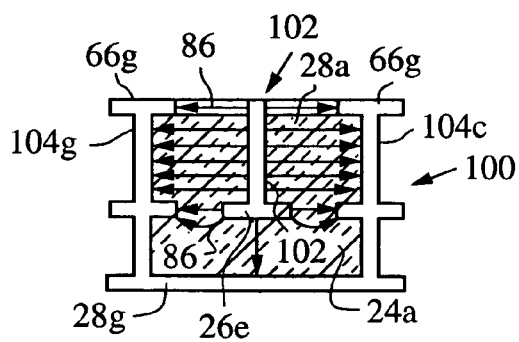

FIGS. 6A and 6B show respectively a top view and a cross-sectional view along lines 6B—6B of a caged troughline transition line structure 100 formed in laminate layer 28 (FIGS. 3A, 30). The location of 6B is also shown in FIG. 2A.

Figure 7B:
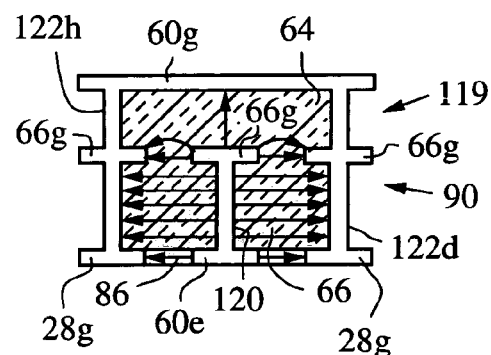
FIGS. 7B and 7A show respectively a top view and a cross-sectional view along the lines 7B, of a caged coaxial transition line contained within the balun layer according to an embodiment of the present invention.
Figure 7A:
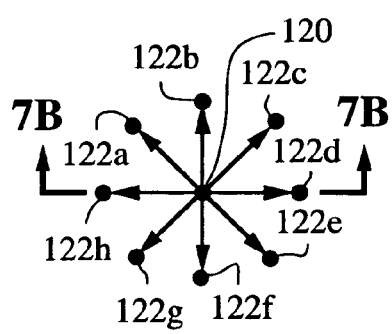

FIGS. 7B and 7A, respectively, show a top view and a cross-sectional view along lines 7B—7B, of a caged coaxial transition line 120 contained within the lower balun layer 66 and upper balun layer 64 of the balun layer 60.

As shown in FIGS. 5A, 5B, 5C and 5D, the channelized microstrip 81 field configuration within the area of cavity 46 transitions to a channelized conductor backed CPW transmission structure 150. The channelized conductor-backed coplanar waveguide 150 may be formed of the channel or gap 84 (FIGS. 5A, 5C) tapering from the input of the CPW 150 to the output. The gap dimensions of the channelized microstrip structure 81, as indicated in FIG. 5A remain essentially constant as gaps 84 between the ground planes 24g formed in the upper metalization layer 24c of the lower laminate 24 and the microstrip conductor 80. As shown in FIG. 5B the field lines 86 in this region of the air cavity 46 are generally between the microstrip 80 and the groundplane 24g formed in the lower metalization layer 24b of the lower laminate 24. These field lines pass through the dielectric 24a of the lower laminate 24. As shown in FIG. 5C, the channels 84 are narrowed toward vertical transition 102, while maintaining a suitable resistance, e.g., 50 ohm impedance. At the same time the E-field 86 concentrates more across the gaps 84 and less along a bottom groundplane 24g through the dielectric 24a on which the microstrip 80 is formed. This redistribution of the E-fields 86 across the gaps 84 continues, so that the E-fields are shaped to be essentially parallel to the plane of the microstrip conductor 80 in order to allow the RF signal to transition to the caged troughline 102 (FIG. 6B) to realize a matched vertical transition with minimal discontinuity. The caged troughline 102 then transitions to a caged coaxial 120 as the RF signal enters the balun layer 60 as described in more detail below.

As shown in FIG. 6A and FIG. 6B, a caged troughline transition 100 is formed by a vertical signal transition post 102 extending vertically through the upper laminate 28 from the contact pad 82 of the microstrip 80 at the terminus of the tapered regions of the gap 84 where the E-fields have been rendered essentially horizontal. Surrounding the post 102 are a plurality of generally evenly spaced apart posts 104a–104g. The posts 104a–104g are arranged in generally a circular pattern surrounding the post 102 as shown in FIG. 6A with an opening 106 in the pattern to allow for interconnection to the most tapered end of the CPW structure 150 as shown in FIG. 5C and FIG. 5D. The upper ends of the posts 104a–104g are in electrical contact with an intervening ground plane 60b of the balun/radiator laminate 60 (FIG. 3B). The posts 104a–104g surrounding the pin in the 0.060" thick layer 28a can be formed in vias in the upper laminate 28. The grounded posts 104a–104g are an approximation to a continuous conducting wall forming a grounded shield for transition post 102, which minimizes leakage into the surrounding layers. The grounded posts 104a–104g are also a means to keep the shape of the signal e-field lines 86 transitioning vertically along the post 102 generally horizontal as shown in FIG. 6B.

FIGS. 7A and 7B illustrate a caged coaxial vertical transition 119 which includes a vertical post 120, which is connected to post 102 across an adhesive layer 68 by via 68b connecting catchpads 28e and 60 (FIGS. 3A–3C). Posts 122a–122h form generally a closed equally spaced circular pattern around the post 120, providing an outer shield for the center conductor post 120. The E-fields 86 transition vertically along the posts 122a–122h generally as was the case for posts 102a–102g, maintaining a horizontal orientation from the post 120 to the posts 122a–122h, the posts 122a–102h also serving to shield the post 120 and prevent signal leakage into the surrounding layer.

At high frequencies (5–15 GHz), there may be a mismatch between the caged troughline transmission line 100 and microstrip line 81. To account for this, an embodiment of the invention implements a microstrip matching circuit to obtain better impedance matching for the transition. To obtain a better match, a two-section matching topology is implemented on the microstrip line 80, which can be represented by an inductive and a capacitive element. As shown in FIG. 4, a narrowed discontinuity 83 in the microstrip conductor 80 serves to form an inductive element and the discontinuity from the air dielectric in the cavity 46 and the dielectric 28a dielectric forms the capacitive element.

Important to realizing the microwave transmission line structures within a buried multi-layer flexible PWB is the fabrication of blind and buried vias interconnects between the layer of the laminates. FIG. 3A shows the RF feed 40 to the circulator 44, by way of vias structures in the adhesive layers 18 and 22 and the laminates 16 and 20, along with the catchpads 16e and 20e(FIG. 3C) with laminates 16 and 20.

In conventional PWB fabrication, catch pads are required to facilitate the plating into the via holes. Often complex sequential plating and lamination processes have been used to create blind and buried vias and catchpads. Also the introduction of openings 70 and air cavity pockets 46 add a factor that prohibits using conventional lamination processes. Two novel and simplified lamination processes may be utilized for making buried microwave signal and ground interconnects as employed in embodiments of the present invention. Depending on the application, either one or a combination of both of these two novel methods can be used for the novel construction of new microwave vertical interconnects across a large area of multilayer flexible laminates of section 12 according to embodiments of the present invention. The first method is a colamination process and the second method utilizes anisotropically conductive Z-axis adhesives.

In the colamination process, the pattern of vias 16h, 20h, 24h, 28h, 18b, 22b and 26b can be predrilled into each of the laminate layers 16, 20 and 24 and each of the bondply layers 18, 22 and 26 (FIG. 30). The via holes 16h, 20h, 24h, 28h, 18b, 22b and 26b can then be filled with any of a variety of suitable conductive metal inks or epoxies, e.g., such as transcent liquid phase scintering ("TLPS"), manufactured by Ormer Circuits, Inc., or a copper paste called ALIVH ("any layer interstitial via hole") marketed by Matsushita. The via holes 16h, 20h, 24h, 28h, 18b, 22b and 26b constituting layered pairs are filled with material(s) prior to lamination, and the adhesive bondply layers 18, 22, 26 are then assembled and laminated together. The conductive inks create an interconnect between the catchpads, e.g., 16e on laminate 16 and 20e on laminate 20 thus realizing the microwave via structures for the embodiment of the present invention. This process is known in the art but has not been used for forming signal transitions through a flexible printed wiring board laminate, e.g., for mixed signal or microwave applications. Test results have shown functionality of the RF interconnect up to 13 GHz for a multilayer assembly in one exemplary embodiment.

The second method uses anisotropically conductive Z-axis adhesive films ("ZAF") such as those noted above, as an adhesive to realize the interconnections between the laminates, e.g., 16, 20, 24, 28 and 60. ZAF is an adhesive film filled with conductive particles that allow interconnections between layered pairs through the adhesive thickness (the "Z-axis"). The conductive particles are spaced far enough apart for the ZAF to be electrically insulating in the plane of the adhesive film. Similar to colamination, ZAF can be used in a conventional lamination process to realize RF and DC interconnects of multiple layers with only one or two operations. Unlike colamination, the interconnects realized by ZAF are indiscriminate and thus the layered pairs e.g. 14 may require additional patterned features such as catchpads and/or ground planes and clearouts. The ZAF intermediate paired catchpads and ground planes, are compressed together enough to create a conductive path between the respective features through the more densely compressed conductive particles. In the region of a clearout(s) this compression does not occur and the Z-axis adhesive remains dielectric. Test results have shown the functionality of the RF interconnect up to 16 GHz for a multilayer assembly.

Although the foregoing has been a description and illustration of specific embodiments of the invention, various modifications and changes thereto can be made by persons skilled in the art without departing from the scope and spirit of the invention as defined by the following claims.

What is claimed is:

1. An RF signal transition, comprising:
    a channelized microstrip transmission structure having an input and an output;
    a coplanar wave guide structure having an input and an output, the input of the coplanar waveguide in electrical communication with the output of the channelized microstrip transmission structure;
    a caged troughline transition structure in electrical communication with the output of the coplanar wave guide; and
    a caged coaxial transmission structure having an input and an output, with the input of the caged coaxial transmission structure in electrical communication with the troughline transition structure,
    wherein at least the channelized microstrip transmission structure, the coplanar wave guide structure and the troughline transition structure are buried in a portion of a conformal antenna structure, said portion comprising a laminate of flexible layers.

2. The transition of claim 1 wherein the microstrip transmission structure includes a generally planar dielectric substrate having a microstrip conductor disposed on a surface of the substrate, and the troughline transition comprises:
    a conductive troughline signal post in electrical communication with the output of the coplanar waveguide structure, said post mounted in a direction transverse to said surface;
    a plurality of conductive troughline grounded posts extending substantially parallel to the troughline signal post and positioned substantially surrounding the troughline signal post.

3. The transition of claim 1, further comprising a circulator structure, and wherein said input of said channelized microstrip transmission structure is electrically connected to a circulator device of the circulator structure which is buried in said laminate of flexible layers.

4. The transition of claim 1, wherein:
    the coplanar waveguide structure comprises a conductor-backed dielectric filled channel.

5. The transition of claim 4, wherein the coplanar waveguide structure includes a signal conductor trace and first and second ground traces spaced from the signal conductor trace in a common plane, and wherein gaps between the conductor trace and the respective first and second ground traces taper from the input of the coplanar waveguide structure to the output of the coplanar waveguide structure.

6. An RF signal transition, comprising:
    a channelized microstrip transmission structure having an input and an output, wherein the microstrip transmission structure includes a substantially planar dielectric substrate having a microstrip conductor disposed on a surface of the substrate;
    a coplanar wave guide structure having an input and an output, the input of the coplanar waveguide in electrical communication with the output of the channelized microstrip transmission structure;
    a caged troughline transition structure in electrical communication with the output of the coplanar wave guide; and
    a caged coaxial transmission structure having an input and an output, with the input of the caged coaxial transmission structure in electrical communication with the troughline transition structure, the coaxial transmission structure comprising:
    a center conductive coaxial center post in electrical communication with the output of the trough line transition, said center post oriented in a substantially transverse direction relative to the planar dielectric substrate;
    a plurality of grounded posts extending substantially parallel to the coaxial center post and positioned substantially surrounding the coaxial center post to provide a coaxial outer conductive shield structure.

7. An RF signal transition comprising:
    a channelized coplanar waveguide means for conducting an RF signal from an input to an output in a first direction;
    a caged troughline transition having an input and an output, with the input of the troughline transition in electrical communication with the output of the channelized coplanar waveguide means, the output of the caged troughline transition in electrical communication with an antenna aperture, said caged troughline transition for conducting the RF signal in a second direction which is transverse to said first direction,
    wherein the channelized coplanar waveguide means and the troughline transition are buried in a portion of a flexible multi-layered laminate structure.

8. The apparatus of claim 7, further comprising:
    a caged coaxial transmission structure having an input in electrical communication with the output of said caged troughline transition.

9. The transition of claim 7, wherein the caged troughline transition comprises:
    a substantially vertical first signal transition in electrical communication with the output of the coplanar waveguide means;
    a plurality of first means for shaping the RF signal on the first signal transition and for shielding the first signal transition, said plurality of first means substantially surrounding the first signal transition.

10. The transition of claim 7, wherein the channelized coplanar waveguide means includes a signal conductor trace and first and second ground traces spaced from the signal conductor trace in a common plane, and wherein gaps between the conductor trace and the respective first and second ground traces taper from the input of the coplanar waveguide means to the output of the coplanar waveguide means to provide an E-field characteristic of the RF signal which is substantially between said signal conductor trace and the respective first and second ground traces in general alignment with the common plane.

11. An antenna, comprising:
 a radiator layer assembly comprising a plurality of radiators;
 a circulator layer having a plurality of circulators each in electrical communication with a corresponding one of said plurality of radiators;
 a plurality of transmit/receive (T/R) modules each having an input port and an output port in electrical communication with a corresponding port of a respective one of said circulators;
 an RF feed layer having an input/output (I/O) port and a plurality of T/R module ports connected to a respective one of said T/R modules; and
 wherein said radiator layer assembly and said circulator layer are fabricated in an laminated multi-layer structure including a printed wiring board (PWB) structure, said plurality of circulators embedded within spaces defined in said PWB structure.

12. The antenna of claim 11, further comprising an RF transition within said laminated multi-layer structure for providing an electrical connection between each of said plurality of circulators and the radiator layer assembly, said RF transition comprising for each circulator:
 a channelized microstrip transmission structure having an input and an output, said input being electrically connected to said circulator;
 a coplanar wave guide structure having an input and an output, the input of the coplanar waveguide in electrical communication with the output of the channelized microstrip transmission structure;
 a caged troughline transition structure in electrical communication with the output of the coplanar wave guide; and
 a caged coaxial transmission structure having an input and an output, with the input of the caged coaxial transmission structure in electrical communication with the troughline transition structure, said coaxial transmission structure having a transverse orientation relative to an orientation of the microstrip transmission structure.

13. The antenna of claim 12, wherein each of said plurality of circulators is mounted within an air pocket defined in said PWB structure.

14. The antenna of claim 13, further including a plurality of ground vias substantially surrounding the air pocket to provide RF shielding of said pocket.

15. The antenna of claim 14, wherein said channelized microstrip transmission structure is mounted within said air pocket, and at least some of said plurality of ground vias define side walls of the microstrip transmission structure.

16. The antenna of claim 12, wherein:
 the coplanar waveguide structure comprises a conductor-backed dielectric filled channel.

17. The antenna of claim 16, wherein the coplanar waveguide structure includes a signal conductor trace and first and second ground traces spaced from the signal conductor trace in a common plane, and wherein gaps between the conductor trace and the respective first and second ground traces taper from the input of the coplanar waveguide structure to the output of the coplanar waveguide structure.

18. The antenna of claim 12, wherein the microstrip transmission structure includes a dielectric substrate having a microstrip conductor disposed on a surface of the substrate, and the troughline transition comprises:
 a conductive troughline signal post in electrical communication with the output of the coplanar waveguide structure, said post mounted in a direction transverse to said surface;
 a plurality of conductive troughline grounded posts extending substantially parallel to the troughline signal post and positioned substantially surrounding the troughline signal post.

19. The antenna of claim 12 wherein the microstrip transmission structure includes a dielectric substrate having a microstrip conductor disposed on a surface of the substrate, and the caged coaxial transmission structure comprises:
 a center conductive coaxial center post in electrical communication with an output of the troughline transition structure, said center post oriented in a substantially transverse direction relative to the planar dielectric substrate;
 a plurality of grounded posts extending substantially parallel to the coaxial center post and positioned substantially surrounding the coaxial center post to provide a coaxial outer conductive shield structure.

20. The antenna of claim 11, wherein said laminated multi-layer structure is a curved structure.

21. The antenna of claim 20, wherein the antenna is conformal to a non-planar shape.

22. The antenna of claim 11 wherein the radiator layer assembly comprises a balun layer and a radiator layer.

23. An RF signal transition method comprising:
 utilizing a channelized coplanar waveguide, receiving, and horizontally transmitting an RF signal from a coplanar waveguide input to a coplanar waveguide output;
 utilizing a first vertical caged coaxial troughline transition, vertically transmitting said RF signal to a troughline output;
 utilizing a caged coaxial transition, vertically transmitting said RF signal from an input in electrical communication with the troughline output to a coaxial output, and
 at least the channelized coplanar waveguide, and the troughline transition are buried in a portion of a flexible multi-layered laminate structure.

24. The method of claim 23, wherein the flexible multi-layered laminate structure has a curved shape.

25. The method of claim 23 wherein:
 the coplanar waveguide includes a signal conductor trace and first and second ground traces spaced from the signal conductor trace in a common plane, and wherein gaps between the conductor trace and the respective first and second ground traces taper from the input of the coplanar waveguide to the output of the coplanar waveguide.

26. The method of claim 23 wherein:
 the coplanar waveguide comprises a conductor backed dielectric filled channel tapering over a portion of the coplanar waveguide to the output of the coplanar waveguide.

* * * * *